(12) United States Patent
Hou et al.

(10) Patent No.: US 10,374,055 B2
(45) Date of Patent: Aug. 6, 2019

(54) BUFFER LAYER ON SEMICONDUCTOR DEVICES

(71) Applicant: TAIWAN SEMICONDUCTOR MANUFACTURING COMPANY, LTD., Hsinchu (TW)

(72) Inventors: Cheng-Hao Hou, Hsinchu (TW); Wei-Yang Lee, Taipei (TW); Xiong-Fei Yu, Hsinchu (TW); Kuang-Yuan Hsu, Fongyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 146 days.

(21) Appl. No.: 14/303,045

(22) Filed: Jun. 12, 2014

(65) Prior Publication Data

US 2014/0291777 A1  Oct. 2, 2014

Related U.S. Application Data

(62) Division of application No. 13/195,554, filed on Aug. 1, 2011, now Pat. No. 8,765,603.

(51) Int. Cl.
| | |
|---|---|
| *H01L 29/51* | (2006.01) |
| *H01L 29/49* | (2006.01) |
| *H01L 21/28* | (2006.01) |
| *H01L 29/78* | (2006.01) |

(52) U.S. Cl.
CPC ...... *H01L 29/517* (2013.01); *H01L 21/28088* (2013.01); *H01L 29/495* (2013.01); *H01L 29/4941* (2013.01); *H01L 29/4958* (2013.01); *H01L 29/4966* (2013.01); *H01L 29/513* (2013.01); *H01L 29/7833* (2013.01)

(58) Field of Classification Search
CPC ....... H01L 21/28088; H01L 21/823842; H01L 29/665; H01L 29/517; H01L 29/495; H01L 29/4958; H01L 29/4966; H01L 29/513; H01L 29/4941
USPC .................................. 257/E21.199, E21.438
See application file for complete search history.

(56) References Cited

U.S. PATENT DOCUMENTS

| | | | | |
|---|---|---|---|---|
| 6,054,355 A | * | 4/2000 | Inumiya | ............ H01L 21/28114 257/E21.205 |
| 6,858,524 B2 | * | 2/2005 | Haukka | ............. H01L 21/28088 257/E21.204 |

(Continued)

OTHER PUBLICATIONS

Quevedo-Lopez et al. "Thermal stability of hafnium-silicate and plasma-nitrided hafnium silicate films studied by Fourier transform infrared spectroscopy" (Applied Physics Letters vol. 87, p. 012902. Published by American Institute of Physics in 2005.).*

(Continued)

*Primary Examiner* — Tuan A Hoang
(74) *Attorney, Agent, or Firm* — Hauptman Ham, LLP (57) ABSTRACT

A semiconductor device including a substrate having a source region, a drain region, and a channel region disposed between the source region and the drain region. Additionally, the semiconductor device includes a high-k dielectric layer formed over the channel region, an n-metal formed over the high-k dielectric layer and a barrier layer formed between the high-k dielectric layer and the n-metal, the barrier layer including a layer of annealed silicon.

20 Claims, 5 Drawing Sheets

(56) References Cited

U.S. PATENT DOCUMENTS

| | | | |
|---|---|---|---|
| 7,517,746 B2* | 4/2009 | Lin | H01L 21/28079 |
| | | | 257/E21.409 |
| 7,521,309 B2 | 4/2009 | Kaneko et al. | |
| 7,902,610 B2 | 3/2011 | Tai et al. | |
| 8,188,547 B2* | 5/2012 | Manabe | H01L 21/823842 |
| | | | 257/369 |
| 2006/0154413 A1* | 7/2006 | Luo | H01L 21/28097 |
| | | | 438/197 |
| 2006/0264066 A1* | 11/2006 | Bartholomew | C23C 16/308 |
| | | | 438/785 |
| 2008/0076216 A1* | 3/2008 | Pae | H01L 21/28088 |
| | | | 438/257 |
| 2008/0105920 A1* | 5/2008 | Hirano | H01L 21/823842 |
| | | | 257/327 |
| 2008/0242017 A1* | 10/2008 | Lee | H01L 21/823807 |
| | | | 438/231 |
| 2009/0236746 A1* | 9/2009 | Kitamura | H01L 21/76843 |
| | | | 257/751 |
| 2010/0052079 A1* | 3/2010 | Hirano | H01L 21/823842 |
| | | | 257/412 |
| 2010/0151681 A1* | 6/2010 | Knapp | C23C 16/34 |
| | | | 438/680 |
| 2010/0176456 A1* | 7/2010 | Ikeno | H01L 21/823857 |
| | | | 257/369 |
| 2012/0315749 A1* | 12/2012 | Hempel | H01L 21/28176 |
| | | | 438/591 |
| 2013/0020656 A1* | 1/2013 | Jakubowski | H01L 21/28088 |
| | | | 257/410 |
| 2015/0364473 A1* | 12/2015 | Kim | H01L 29/78 |
| | | | 257/369 |

OTHER PUBLICATIONS

Nicolet, Marc-A. "Ternary amorphous metallic thin films as diffusion barrier for Cu metallization" in Applied Surface Science, vol. 91, pp. 269-276. Published by Elsevier in 1995.*

Nicolet "Ternary amorphous metallic thin films as diffusion barriers for Cu metallization", Applied Surface Science vol. 91, pp. 269-276. Published by N.H. Elsevier in 1995. (Year: 1995).*

* cited by examiner

BUFFER LAYER ON SEMICONDUCTOR DEVICES

PRIORITY CLAIM

The present application is a divisional of U.S. application Ser. No. 13/195,554, filed Aug. 1, 2011, which is incorporated herein by reference in its entirety.

BACKGROUND

High-k dielectric materials are now used in many semiconductor devices as replacements for the silicon dioxide gate insulator that has previously been used. The high-k dielectric materials allow the continued scaling of semiconductor devices to smaller dimensions without sacrificing performance of the semiconductor devices. Polysilicon is a gate electrode material used in semiconductor devices which use silicon dioxide as the gate insulator. To manage the inherent threshold voltage value in the semiconductor devices that use high-k dielectric materials as the gate insulator, the polysilicon is replaced by an n-type or p-type metal. Barrier layers are used to prevent diffusion of the n-type or p-type metal toward the high-k dielectric materials as the diffusion may cause Time Dependent Dielectric Breakdown (TDDB) of the semiconductor devices. Thinner barriers that prevent diffusion of the n-type or p-type metal toward the high-k dielectric allow smaller, more reliable, more power efficient and faster semiconductor devices to be fabricated.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

Figure 1:
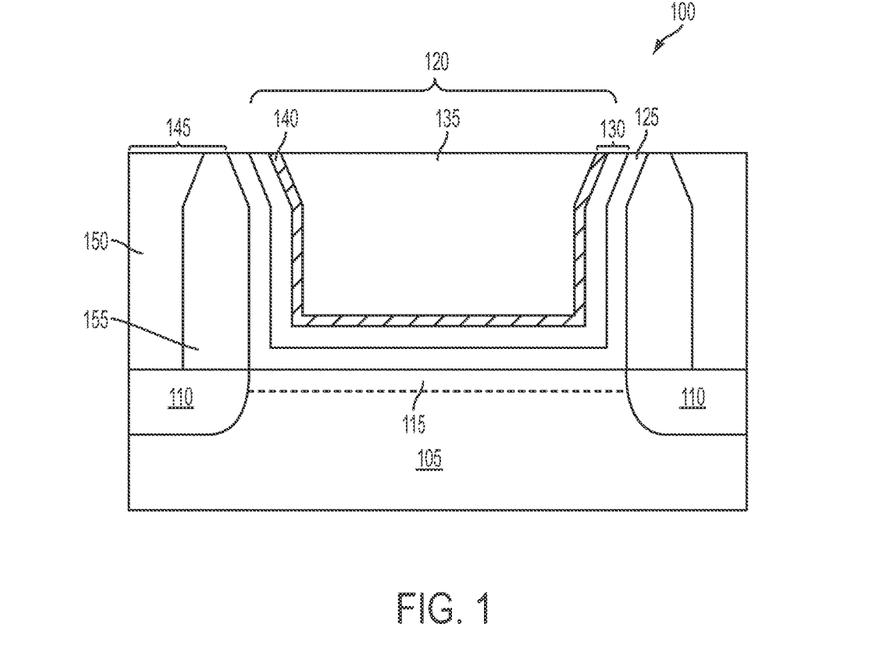
FIG. 1 is a cross-section view of a semiconductor device according to an embodiment.

FIG. 1 is a cross-section view of a semiconductor device 100 according to an embodiment. The semiconductor device 100 comprises a substrate 105 in which source/drain regions 110 are formed toward an upper portion thereof. A channel region 115 is formed in the substrate 105 between the source/drain regions 110. A gate 120 comprising a gate dielectric layer 125, a cap barrier layer 130 and a metal gate stack 135 is formed over the channel region 115 and the source/drain regions 110. The cap barrier layer 130 further comprises an annealed silicon portion 140.

In some embodiments, an inter-layer dielectric 145 is formed over the substrate 105. The inter-layer dielectric 145 comprises a dielectric 150 deposited on either side of the gate 120 of the semiconductor device 100. In some embodiments, spacers 155 are formed between the dielectric 150 and the gate 120. In some embodiments, the spacers 155 define an opening in the inter-layer dielectric 145 in which the gate dielectric layer 125, the cap barrier layer 130 and the metal gate stack 135 are formed. In some embodiments, the dielectric 150 is formed of silicon oxide or an insulating material having a low dielectric constant. In some embodiments, the source/drain regions 110 are defined by a dummy gate structure (not shown) and the spacers 155, the dummy gate structure and the spacers 155 being used either separately or together as masks for one or more implantations. In some embodiments, source/drain regions 110 comprise lightly doped drain (LDD) regions.

The gate dielectric layer 125 insulates the gate from the channel. The gate dielectric layer 125 is a high-k dielectric layer which comprises a layer having a dielectric constant greater than the dielectric constant of silicon dioxide. In some embodiments, the gate dielectric layer 125 may include hafnium oxide, hafnium oxide doped with one or more of zirconium, aluminum oxide, tantalum oxide, zirconium oxide, indium oxide, lanthanum oxide or yttrium oxide, hafnium silicon oxide, hafnium silicon oxynitride, hafnium tantalum oxide, hafnium titanium oxide, hafnium zirconium oxide hafnium aluminum oxide, aluminum silicon oxide, strontium oxide, strontium titanium oxide, yttrium silicon oxide, and/or combinations thereof. The gate dielectric layer 125 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. In some embodiments, the gate dielectric layer 125 may have a thickness in the range of about 1 to 4 nm.

The gate dielectric layer 125 may be formed by suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The cap barrier layer 130 is formed over the gate dielectric layer 125. The cap barrier layer 130 prevents diffusion of atoms ions and molecules between the gate dielectric layer 125 and material formed over the cap barrier layer 130, including the various materials (for example, Ti, Ag, Al, TiAl, TiAlN, TaC, TaCN, TaSiN, Mn, and/or Zr) in the metal gate stack 135. In some embodiments, the cap barrier layer 130 is formed from titanium nitride and includes an annealed silicon layer 140. In some embodiments, the annealed silicon portion 140 comprises silicon that has reacted with titanium in the titanium nitride to form a titanium silicide alloy.

Suitable techniques for forming the titanium nitride in the cap barrier layer 130 can be used such as physical vapor deposition (PVD), metal organic chemical vapor deposition (MOCVD), pulsed laser deposition (PLD), atomic layer deposition (ALD) and other film growth techniques. Alternatively, titanium nitride can be formed by using low pressure chemical vapor deposition (LPCVD), plasma enhanced chemical vapor deposition (PECVD), high density plasma chemical vapor deposition (HDPCVD), or various sputtering techniques, to a thickness suitable for forming a titanium nitride layer.

The metal gate stack 135 is formed over the cap barrier layer 130. In some embodiments, the metal gate stack 135 includes a work function layer, a metal diffusion blocking layer and a metal filling line sequentially formed over the cap barrier layer 130.

In some embodiments, the metal gate stack 135 comprises an n-type metal. In some embodiments the n-type metal is formed from materials such as metal, metal carbide, metal nitride hafnium, zirconium, titanium, tantalum, aluminum, metal carbides, other suitable materials, or the combinations thereof. In one or more embodiments, the n-type metal comprises at least one of titanium, aluminum, titanium-aluminum, titanium nitride, cobalt, tungsten nitride, or tantalum carbide. For example, the n-type metal comprises at least one of titanium, aluminum, titanium-aluminum, when metal gate stack 135 is a part of an N-channel MOS (NMOS) transistor.

If the metal gate stack 135 contains aluminum, the aluminum diffuses through the cap barrier layer 130 toward the gate dielectric layer 125 if the cap barrier layer 130 material is titanium nitride. Incorporating silicon into the titanium nitride cap barrier layer 130 prevents the diffusion of aluminum and increases the life of the semiconductor device 100.

The annealed silicon portion 140 in FIG. 1 is formed at a surface of the cap barrier layer 130 adjacent to the metal gate stack 135. In some embodiments, the annealed silicon portion 140 is formed at a surface of the cap barrier layer 130 adjacent to an n-metal portion of the metal gate stack 135.

Figure 2:
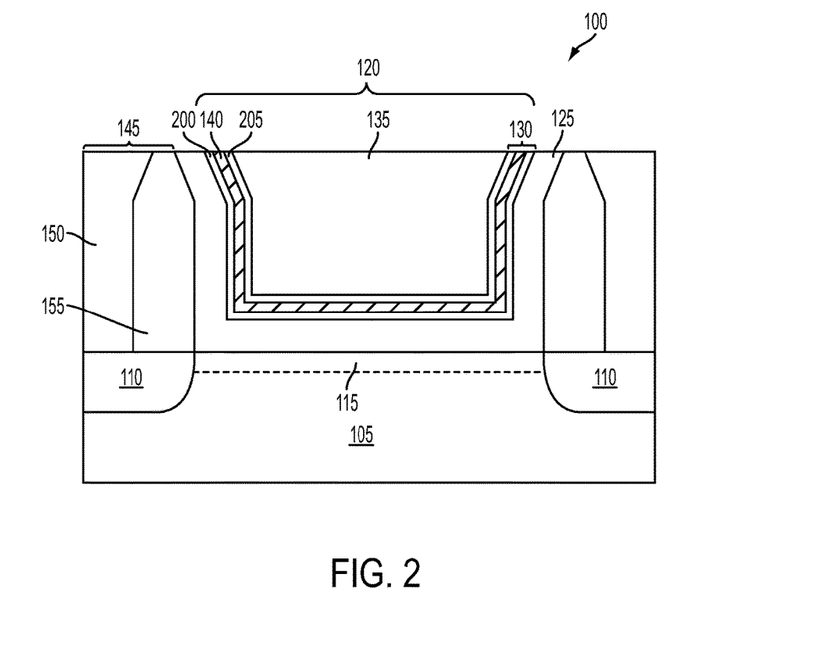
FIG. 2 is a cross-section view of a semiconductor device according to another embodiment.

FIG. 2 is a cross-section view of a semiconductor device according to another embodiment. The cap barrier layer 130 comprises a titanium nitride portion 200, 205 and the annealed silicon portion 140. In some embodiments, the annealed silicon portion 140 comprises silicon that has reacted with titanium in the titanium nitride to form a titanium silicide alloy.

The annealed silicon portion 140 in FIG. 2 is formed away from surfaces of the cap barrier layer 130, so that titanium nitride layers 200, 205 are formed on either side of the annealed silicon portion 140, separating the annealed silicon portion 140 from the gate dielectric layer 125 and the metal gate stack 135.

Figure 3:
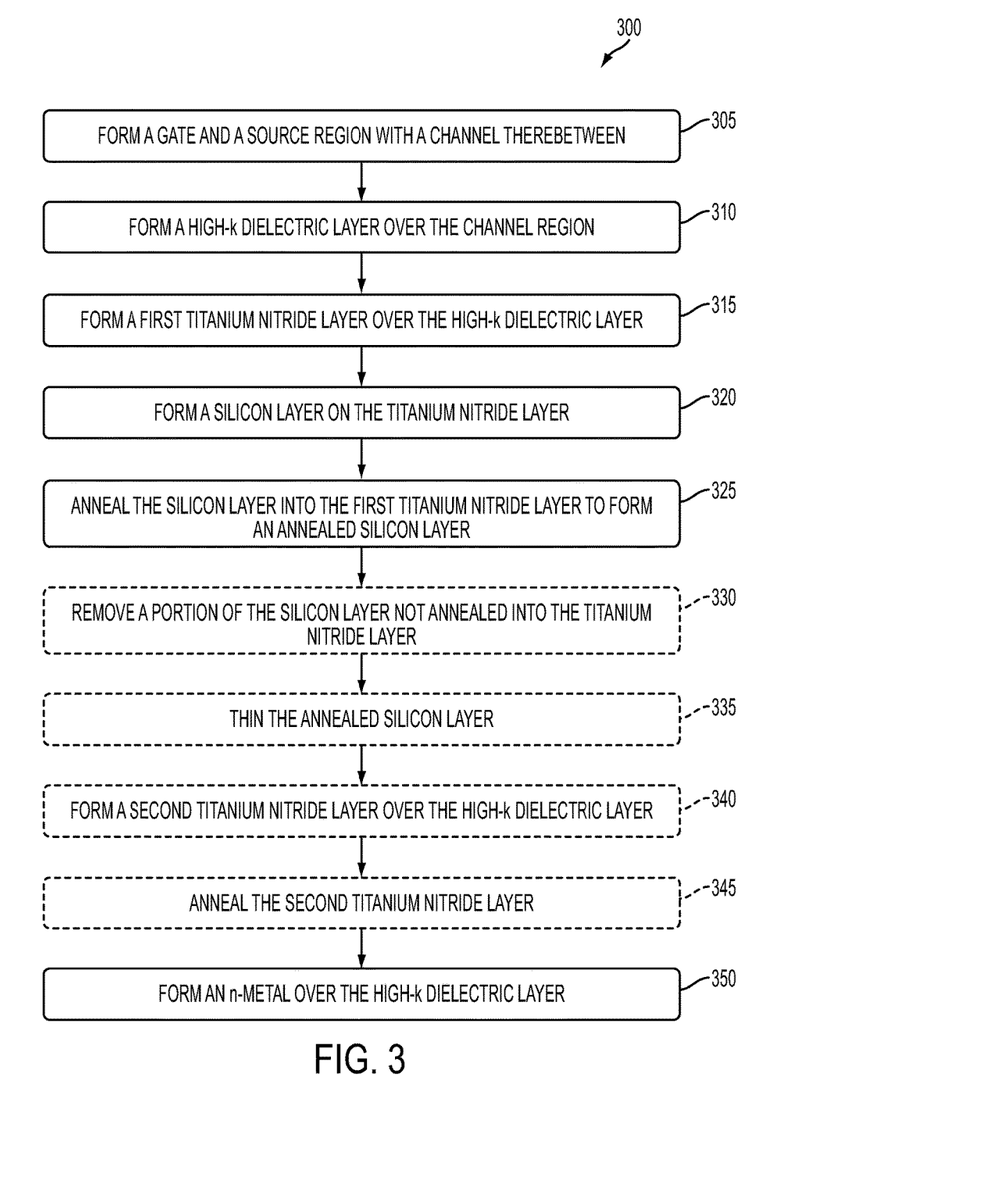
FIG. 3 is a flow chart for a method of forming the semiconductor device of FIGS. 1 and 2.

FIG. 3 is a flow chart for a method 300 of forming the semiconductor device 100 of FIGS. 1-2.

The method begins at step 305 in which the drain and source regions 110 (FIG. 1) are formed in the substrate 105 (FIG. 1). In some embodiments, the drain and source regions 110 are formed by one or more implantations using the dummy gate and the spacers 155 as masks. A portion of the substrate between the drain and source regions 110 becomes the channel region 115. The method proceeds to step 310.

At step 310, the high-k dielectric layer 125 is formed over the channel region 115 using one of the material and deposition methods discussed above. The method proceeds to step 315.

Steps 315 to 345 are then performed to form the cap barrier layer 130 as in FIGS. 1 and 2. These steps include optional steps 330 to 345.

Specifically, at step 315, a titanium nitride layer 200 is formed over the high-k dielectric layer using one of the material and deposition methods discussed above. The thickness of the titanium nitride layer 200 is in the range from about 0.5 nm to 4 nm thick. The method proceeds to step 320.

Figure 4:
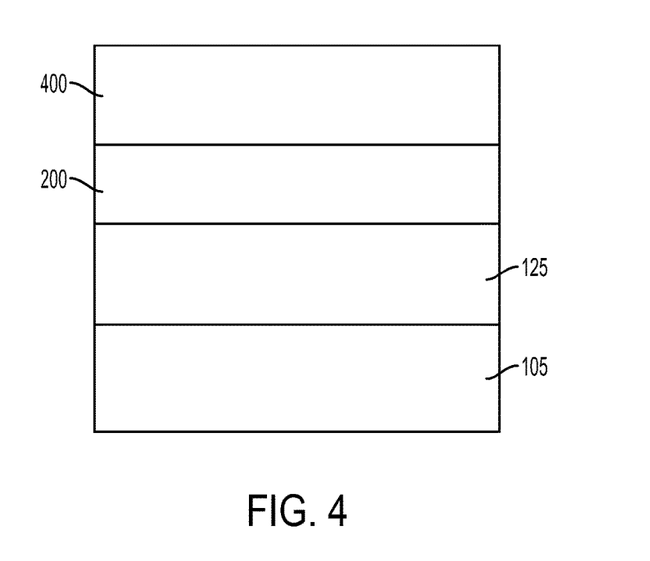
FIG. 4 is a cross-section view of a portion of the cap barrier layer of FIGS. 1 and 2 during fabrication according to another embodiment.

Referring to FIGS. 3 and 4, at step 320, a silicon layer 400 is formed on the titanium nitride layer 200. In some embodiments, the silicon layer 400 is formed to a thickness of from 5 Å to 10 Å. In some embodiments, the silicon thickness is selected so that in a subsequent annealing step all of the deposited silicon is consumed by the titanium nitride 200 to form compounds of silicon. In other embodiments, the silicon layer 400 is formed to a thickness of from 50 Å to 1000 Å. The method proceeds to step 325.

Figure 5:
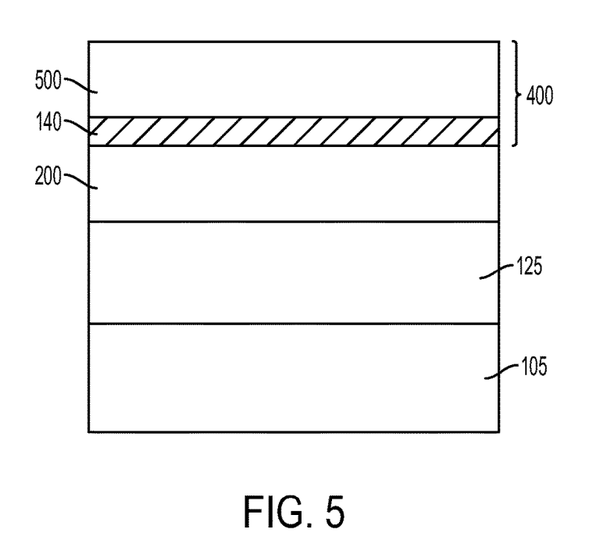
FIG. 5 is a cross-section view of a portion of the cap barrier layer of FIGS. 1 and 2 during fabrication according to another embodiment.

Referring to FIGS. 3 and 5, at step 325, the silicon layer 400 is annealed into the titanium nitride layer 200 to form an annealed silicon layer 140. In some embodiments, the anneal is an oven anneal at from 400° C. to 1200° C. for from 10 minutes to 30 minutes. In other embodiments, the anneal is a rapid thermal anneal at from 500° C. to 1200° C. for from 0.01 minutes to 1 minutes. In some embodiments, the annealed silicon layer 140 comprises titanium silicide. In some embodiments, the anneal step 325 consumes all of the silicon layer 400. In other embodiments, a portion 500 of the silicon layer 400 is not consumed by the anneal step 325. The method proceeds to step 330.

At step 330, a portion of the silicon layer not consumed (i.e., portion 500) is optionally removed. In some embodiments, the portion 500 of the silicon layer 400 is removed using a wet etch solution comprising dilute hydrofluoric acid and ammonium hydroxide. The dilute hydrofluoric acid and ammonium hydroxide does not etch the silicon layer annealed into the titanium nitride, annealed silicon layer 140. Therefore, the above etch solution removes the remaining portion 500 that was not consumed during the anneal process without thinning the annealed silicon layer 140. In some embodiments, the ratio of dilute hydrofluoric acid and ammonium hydroxide is in the range from 1:20 to 1:100. The method proceeds to step 335.

At step 335, the annealed silicon layer 140 is optionally thinned. In some embodiments, the annealed silicon layer 140 is thinned using a wet etch solution comprising dilute hydrofluoric acid and hydrogen peroxide. In some embodiments, the ratio of dilute hydrofluoric acid and hydrogen peroxide is in the range from 1:10 to 1:500. The method proceeds to step 340.

At step 340, a second layer of titanium nitride 205 is optionally formed on the annealed silicon layer 140 to form the structure as in FIG. 2 with titanium nitride layers 200, 205 on either side of the annealed silicon layer 140. In some embodiments, the thickness of the second layer of titanium nitride 205 is in the range from 0.5 nm to 2.5 nm thick. The method proceeds to step 345.

At step 345, the second layer of titanium nitride 205 is optionally annealed. In some embodiments, the anneal is an oven anneal at from 400° C. to 1200° C. for from X 10 minutes to 30 minutes. In other embodiments, the anneal is a rapid thermal anneal at from 500° C. to 1200° C. for from 0.01 minutes to 1 minute. The method proceeds to step 350.

At step 350, the metal gate stack 135 including the n-metal is formed over cap barrier layer 130 using a combination of the materials and deposition methods discussed above. In some embodiments, the metal gate stack 135 comprises aluminum.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

According to some embodiments, a semiconductor device including a substrate having a source region, a drain region, and a channel region disposed between the source region and the drain region. Additionally, the semiconductor device includes a high-k dielectric layer formed over the channel region, an n-metal over the high-k dielectric layer and a barrier layer between the high-k dielectric layer and the n-metal, the barrier layer including a layer of annealed silicon.

According to some embodiments, a semiconductor device includes a high-k dielectric layer over a substrate, a titanium nitride layer over the high-k dielectric layer, a silicon layer on the titanium nitride layer, where the silicon layer is annealed into the titanium nitride layer. Additionally, the semiconductor device includes an n-metal over the high-k dielectric layer.

According to some embodiments, a semiconductor device includes a gate dielectric over a substrate, a cap barrier layer over the gate dielectric layer, a silicon layer on the cap barrier layer, where the silicon layer is annealed into the cap barrier layer. Additionally, the semiconductor device includes an n-metal over the annealed silicon layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   a substrate having a source region, a drain region, and a channel region disposed between the source region and the drain region;
   a high-k dielectric layer over the channel region;
   an n-metal over the high-k dielectric layer, wherein the n-metal is free of silicon; and
   a barrier layer between the high-k dielectric layer and the n-metal, the barrier layer comprising:
      a layer of titanium silicide alloy,
      a first layer of titanium nitride,
      a second layer of titanium nitride, wherein the layer of titanium silicide alloy is between the first layer of titanium nitride and the second layer of titanium nitride, and
      a silicon layer between the second layer of titanium nitride and the layer of titanium silicide alloy.

2. The semiconductor device of claim 1, wherein the second layer of titanium nitride is between the n-metal and the layer of titanium silicide alloy.

3. The semiconductor device of claim 1, wherein the high-k dielectric layer comprises at least one of hafnium oxide, zirconium, aluminum oxide, tantalum oxide, indium oxide, lanthanum oxide, hafnium silicon oxynitride, hafnium tantalum oxide, or strontium oxide.

4. The semiconductor device of claim 1, wherein the n-metal comprises at least one of hafnium, zirconium, titanium, aluminum, or metal carbide.

5. The semiconductor device of claim 1, wherein the high-k dielectric layer has a thickness ranging from about 1 nm to about 4 nm.

6. The semiconductor device of claim 1, wherein the source region and the drain region comprise lightly doped regions.

7. The semiconductor device of claim 1, wherein the barrier layer is between sidewalls of the n-metal and sidewalls of the high-k dielectric layer.

8. The semiconductor device of claim 1, wherein an upper-most surface of the n-metal has a width greater than a width of a bottommost surface of the n-metal.

9. A semiconductor device comprising:
   a high-k dielectric layer over a substrate;
   a first titanium nitride layer over the high-k dielectric layer;
   a titanium silicide alloy layer on the first titanium nitride layer;
   an n-metal over the high-k dielectric layer;
   a second titanium nitride layer between the titanium silicide alloy layer and the n-metal; and
   a silicon layer between the second titanium nitride layer and the titanium silicide alloy layer.

10. The semiconductor device of claim 9, wherein the n-metal comprises at least one of hafnium, zirconium, titanium, aluminum, or metal carbide.

11. The semiconductor device of claim 9, wherein the high-k dielectric layer has a thickness ranging from about 1 nm to about 4 nm.

12. The semiconductor device of claim 9, wherein the second titanium nitride layer is between sidewalls of the n-metal and sidewalls of the high-k dielectric layer.

13. The semiconductor device of claim 9, wherein a top-most surface of the first titanium nitride layer is co-planar with a top-most surface of the second titanium nitride layer.

14. The semiconductor device of claim 9, wherein an upper-most surface of the n-metal has a width greater than a width of a bottommost surface of the n-metal.

15. A semiconductor device comprising:
   a gate dielectric layer over a substrate;
   a cap barrier layer over the gate dielectric layer, wherein the cap barrier layer comprises titanium nitride;
   a silicide alloy layer between the cap barrier layer and the gate dielectric;
   a lower barrier layer between the gate dielectric layer and the silicide alloy layer;
   a silicon layer over the silicide alloy layer;
   an n-metal over the silicon layer, wherein an upper-most surface of the n-metal has a width greater than a width of a bottommost surface of the n-metal; and
   a spacer surrounding the gate dielectric layer, wherein a top surface of the spacer is substantially coplanar with a top surface of the cap barrier.

16. The semiconductor device of claim 15, wherein the gate dielectric layer has a thickness ranging from about 1 nm to about 4 nm.

17. The semiconductor device of claim 15, wherein the n-metal comprises at least one of hafnium, zirconium, titanium, aluminum, or metal carbide.

18. The semiconductor device of claim 15, wherein the gate dielectric layer comprises at least one of hafnium oxide, zirconium, aluminum oxide, tantalum oxide, indium oxide, lanthanum oxide, hafnium silicon oxynitride, hafnium tantalum oxide, or strontium oxide.

19. The semiconductor device of claim 15, wherein the cap barrier layer is between sidewalls of the n-metal and sidewalls of the gate dielectric layer.

20. The semiconductor device of claim 15, wherein a top-most surface of the lower barrier layer is co-planar with a top-most surface of the cap barrier layer.

* * * * *